United States Patent [19]

Thomas et al.

[11] Patent Number: 4,929,992
[45] Date of Patent: May 29, 1990

[54] MOS TRANSISTOR CONSTRUCTION WITH SELF ALIGNED SILICIDED CONTACTS TO GATE, SOURCE, AND DRAIN REGIONS

[75] Inventors: Mammen Thomas, San Jose; Matthew Weinberg, Mountain View, both of Calif.

[73] Assignee: Advanced Micro Devices, Inc., Sunnyvale, Calif.

[21] Appl. No.: 869,759

[22] Filed: Jun. 2, 1986

Related U.S. Application Data

[63] Continuation-in-part of Ser. No. 777,149, Sep. 18, 1985.

[51] Int. Cl.[5] .................. H01L 29/78; H01L 29/04; H01L 27/12
[52] U.S. Cl. .................. 357/23.9; 357/23.1; 357/23.3; 357/41; 357/49; 357/59; 357/67
[58] Field of Search .................. 357/23.1, 23.9, 23.3, 357/41, 49, 59 G, 59 I, 59 J, 59 K, 67

[56] References Cited

U.S. PATENT DOCUMENTS

| | | | |
|---|---|---|---|
| 4,466,176 | 8/1984 | Temple | 357/23.9 |
| 4,477,310 | 10/1984 | Park et al. | 357/42 |
| 4,506,437 | 3/1985 | Godejahn, Jr. | 357/23.9 |
| 4,507,847 | 4/1985 | Sullivan | 357/42 |
| 4,541,169 | 9/1985 | Bartush | 357/49 |
| 4,577,391 | 3/1986 | Hsia et al. | 357/23.9 |
| 4,583,106 | 4/1986 | Anantha et al. | 357/44 |
| 4,599,136 | 7/1986 | Araps et al. | 357/49 |
| 4,621,276 | 11/1986 | Malhi | 357/42 |

FOREIGN PATENT DOCUMENTS

| | | | |
|---|---|---|---|
| 52-14382 | 2/1977 | Japan | 357/23.9 |
| 54-134578 | 10/1979 | Japan | 357/23.9 |

*Primary Examiner*—Andrew J. James
*Assistant Examiner*—Ngan Van Ngo
*Attorney, Agent, or Firm*—John P. Taylor

[57] ABSTRACT

An improved integrated circuit structure is disclosed comprising MOS devices formed with at least raised polysilicon gate contact portions. Metal silicide is formed over at least a portion of the source and drain regions to provide conductive paths to the source and drain contacts. In a preferred embodiment, the source and drain contacts also comprise raised contacts which are also formed from the same polysilicon layer to permit formation of a highly planarized structure with self-aligned contacts formed by planarizing an insulating layer formed over the structure sufficiently to expose the upper surface of all of the contacts.

1 Claim, 13 Drawing Sheets

MOS TRANSISTOR CONSTRUCTION WITH SELF ALIGNED SILICIDED CONTACTS TO GATE, SOURCE, AND DRAIN REGIONS

CROSS REFERENCE TO RELATED APPLICATIONS

This application is a continuation in part of U.S. patent application Ser. No. 777,149, filed Sept. 18, 1985.

BACKGROUND OF THE INVENTION

1. Field of the Invention

This invention relates to the fabrication of an improved MOS device on an integrated circuit substrate. More particularly, this invention relates to the production of at least one MOS transistor on a substrate using self aligned raised polysilicon contacts for at least some of the electrodes with metal silicide surfaces thereon to promote conductivity.

2. Description of the Prior Art

MOS devices are usually constructed in a non planarized fashion with steps created when making contact with the source and drain regions which are lower than the gate region. Also, despite the high density of the MOS devices, the gate contact usually occupies a large area due to the need to make the contact in a position offset to the gate region because of alignment problems.

Furthermore, in the construction of MOS devices, the source and drain junctions may be formed too deep causing the junctions to sometimes extend under the gate region causing overlap capacitance which degrades the performance of the device. The extension of the junction under the gate may be caused by forming the junction too deeply in the substrate. This can also cause the depletion region to extend sideways into the channel causing a short channel effect which further degrades the performance and functionality as well as long term reliability. If the source and drain regions can be formed as shallow junctions, which do not extend laterally, e.g., beneath the gate, the junction capacitance may also be lowered because of the reduction in the junction area.

In our prior U.S. patent application Ser. No. 747,517, filed June, 21, 1985, and entitled FAST BIPOLAR TRANSISTOR FOR INTEGRATED CIRCUIT STRUCTURE AND METHOD OF MAKING SAME, cross reference to which is hereby made, we described and claimed a structure having raised polysilicon emitter and collector contacts with oxide spacers on the sidewalls and a metal silicide conductive path on the surface between the base contact and a point adjacent the oxide spacer on the sidewall of the emitter to provide a faster device with higher gain and lower capacitance and resistance. In one embodiment in that application, the provision of a raised base electrode is also disclosed which provides an advantage in planarization which results from forming all of the contacts in approximately the same plane by the raising of the base contact.

It would be very desirable to be able to fabricate one or more MOS devices on the same substrate in a manner which would address the problems discussed above.

SUMMARY OF THE INVENTION

It is, therefore, an object of this invention to provide an improved integrated circuit structure containing one or more MOS devices having at least some of the electrode contacts formed using polysilicon with self-aligned contacts.

It is another object of this invention to provide an improved integrated circuit structure containing one or more MOS devices having a metal silicide layer over a portion of at least some of the electrode contacts to raise the current carrying capability of the MOS device.

It is a further object of this invention to provide an improved integrated circuit structure containing one or more MOS devices using planarization techniques to provide separate contacts to the electrodes of the devices.

It is a still further object of this invention to provide an improved integrated circuit structure containing one or more MOS devices having raised polysilicon source and drain contacts which may be opened simultaneously with the opening of the gate contact to eliminate steps to the source and drain contacts.

These and other objects of the invention will become apparent from the following description and accompanying drawings.

In accordance with the invention, an improved integrated circuit structure is provided comprising an MOS device having one or more raised polysilicon contacts with oxide spacer portions formed on the sides of the raised gate contact and metal silicide on at least the top surface of the contacts.

In a preferred embodiment, the source and drain contacts are also raised with metal silicide coatings on the side surfaces of the raised source and drain contacts as well as adjacent portions of the source and drain regions to promote conductivity and provide a highly planarized structure.

DESCRIPTION OF THE INVENTION

The invention provides one or more improved MOS devices which may comprise an NMOS device, a PMOS device, or a combination of NMOS and PMOS devices, e.g., a CMOS structure. The MOS devices of the invention may be optionally constructed in conjunction with bipolar devices as described and claimed in our parent application. To illustrate the invention, the formation of both NMOS and PMOS structures will be shown.

Since the MOS devices of the invention may be constructed in an integrated circuit structure in which may also be constructed bipolar devices, one or more buried layers and overlying epitaxial layers may have been formed in the structure prior to forming the MOS devices of this invention.

Therefore, the term "substrate", as used herein, is intended to refer to the underlying semiconductor structure in or on which the MOS device or devices of the invention will be formed, either prior to the formation of any other layers thereon, or after the formation of underlying structure such as, for example, a buried layer and overlying epitaxial layer.

Figure 1:
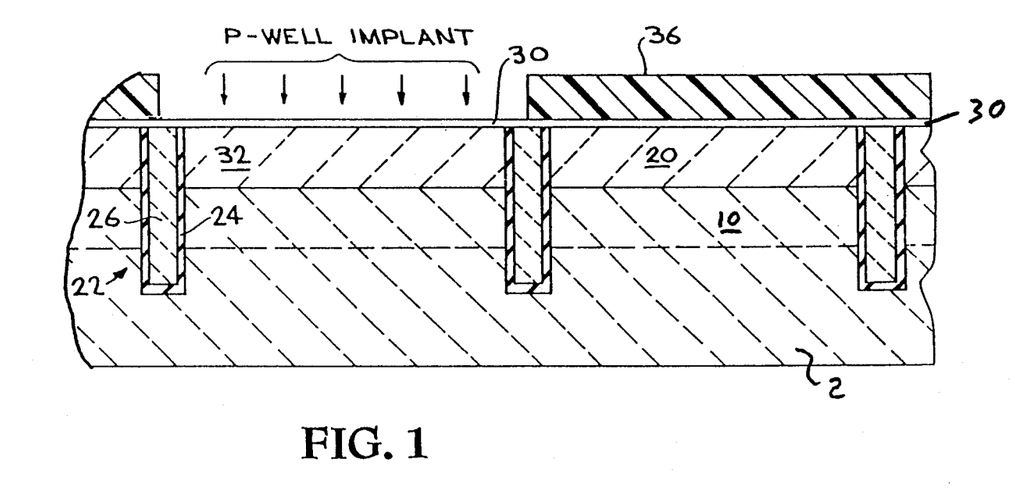
FIG. 1 is a fragmentary vertical cross-sectional view of an integrated circuit structure illustrating an early stage of the construction of the improved integrated circuit structure of the invention.

Referring now to FIG. 1, a silicon substrate 2 is illustrated which may, optionally, have a buried layer 10 formed therein with an N doped epitaxial silicon layer 20 grown over buried layer 10 and a thin buffer layer 30 of oxide, e.g., about 300 Angstroms, applied over epitaxial layer 20. Buried layer 10 may extend over the entire substrate as shown, or may be formed only in those regions in substrate 2 where bipolar devices may ultimately be formed either separately or in conjunction with the MOS devices of this invention.

Isolation slots 22 may be formed in the substrate which are lined with an isolation oxide 24 and then filled at 26 with polysilicon. The adjacent areas in which will be formed other devices, e.g., bipolar and PMOS devices, are then masked at 36, e.g., with a photoresist mask, to permit P implantation into the N epitaxial layer 20 to form P well 32.

It should be noted here, that while a slot type of isolation is illustrated here, other forms of isolation such as isoplanar or junction isolation may also be used in connection with the practice of this invention.

Figure 2:
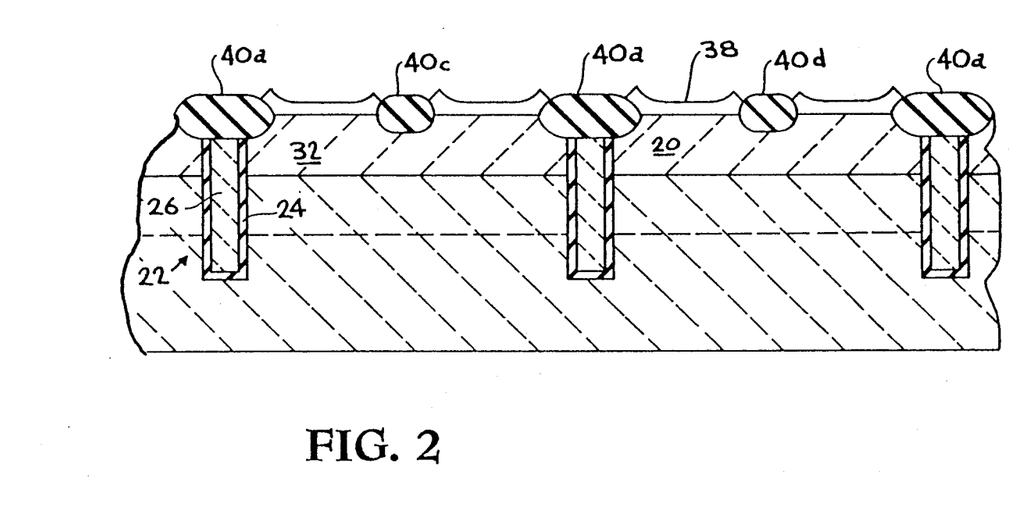
FIGS. 2-8 are fragmentary vertical cross-sectional views illustrating subsequent stages of the construction of one embodiment of the improved integrated circuit structure of the invention.

P well mask 36 is then removed and epitaxial layer 20 is covered with a nitride layer 38, as shown in FIG. 2, which is then appropriately masked to permit growth of field oxide isolation areas 40a, 40c, and 40d. Field oxide areas 40a are formed over slots 22 and cooperate with the slots to separate adjacent devices of different types, e.g., to separate a bipolar device from a PMOS device, and a PMOS device from an NMOS device, etc. Field oxide 40c, in the illustrated embodiment, separates adjacent NMOS devices while field oxide 40d separates adjacent PMOS devices.

After formation of field oxide 40a, 40c, and 40d, nitride mask 38 is removed and a gate oxide layer 46 is then formed on the exposed surfaces of epitaxial layer 20. Gate oxide layer 46 may be partially removed, if bipolar devices are also being constructed, by masking the MOS areas to permit removal of gate oxide layer 46 from any bipolar regions of the structure.

Figure 3:
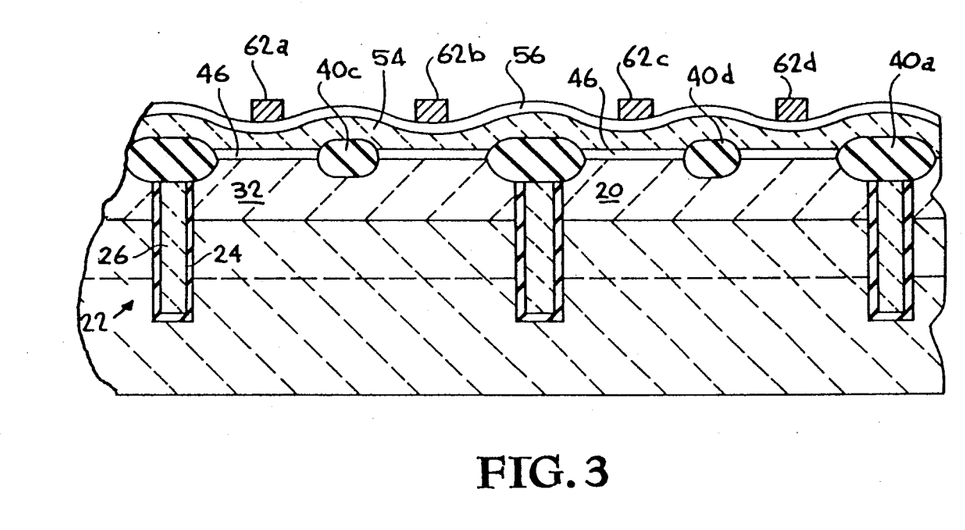

As shown in FIG. 3, a 3000-5000 angstrom polysilicon layer 54 is formed over the entire surface followed by application of a nitride layer 56 thereover. Polysilicon layer 54 is doped with an N dopant, such as, for example, a POCl$_3$ diffusion or an Arsenic+ implant, to form an N+ layer. In one embodiment of the invention, polysilicon layer 54, and nitride layer 56 thereon, are then masked at 62a, 62b, 62c, and 62d to define the gate contacts of the MOS devices to be constructed. The remainder of polysilicon layer 54 is then plasma etched away leaving raised polysilicon gate contacts 80a, 80b, 80c, and 80d as seen in FIG. 4.

Figure 4:
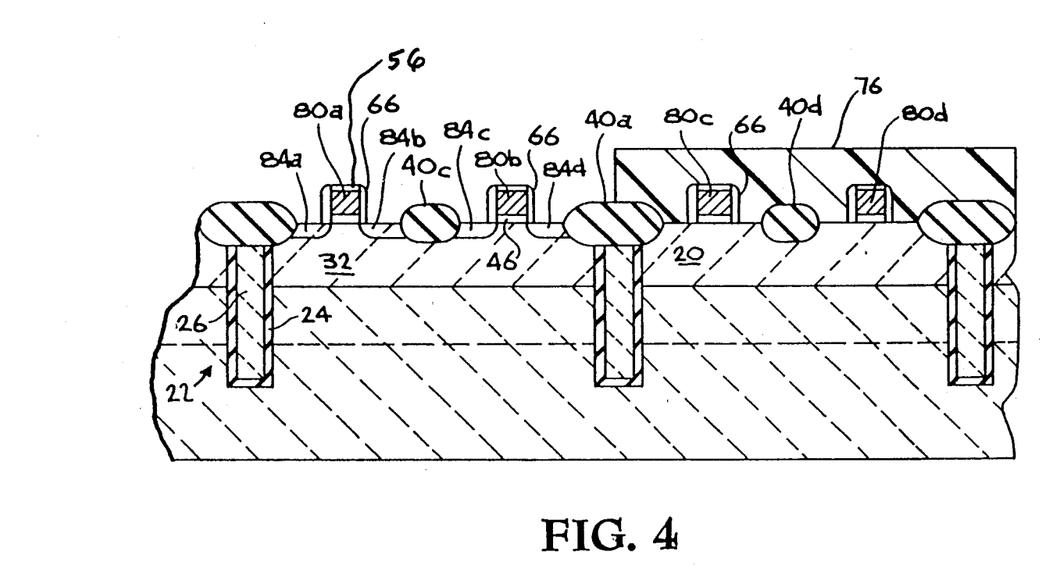

The now exposed gate oxide 46 over the source and drain regions may then be removed using an etchant such as, for example, a NH$_3$ - Acetic acid etch as shown in FIG. 4. A 300 Angstrom protective layer of oxide 66 is then grown on the now exposed sides of polysilicon contacts 80a, 80b, 80c, and 80d by heating the structure for for about 10-20 minutes at about 1000° C., with the remainder of nitride layer 56 (on top of the respective contacts) providing a mask to prevent oxide growth on the top surfaces of the raised contacts.

Any bipolar regions in the structure, as well as the PMOS regions, are then masked with a photoresist mask 76 and lightly doped (LDD) source and drains regions 84a, 84b, 84c, and 84d are formed in P well 32 in the NMOS region by an N- implant as shown in FIG. 4.

Figure 5:
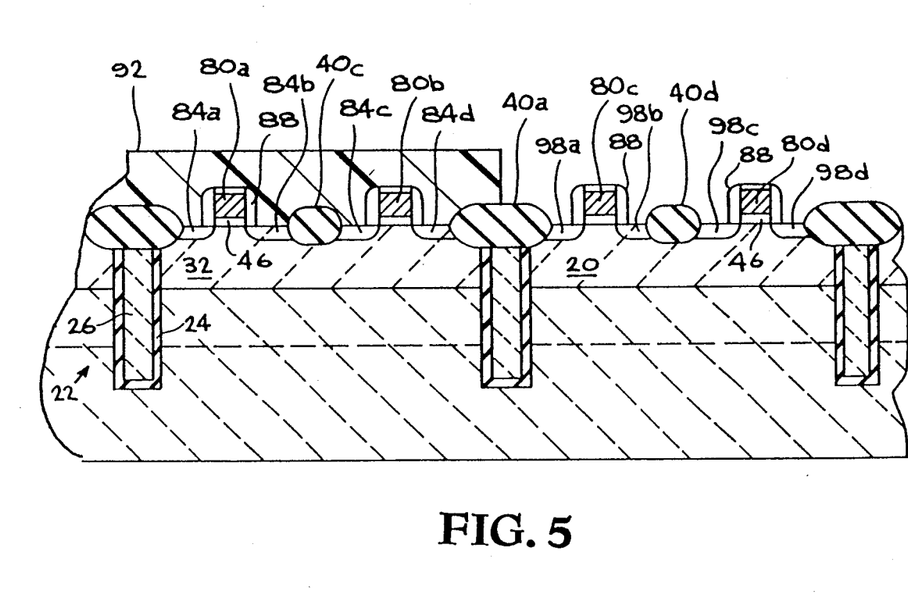

Turning now to FIG. 5, photoresist mask 76 is now removed and a layer of oxide, from which will be formed the oxide spacers, is then formed over the structure. This oxide is then subjected to a reactive ion etch (RIE) to remove most of the oxide leaving only oxide spacer portions 88 on the sides of the raised polysilicon contacts 80a-80d.

It should be noted here, that the oxide spacers portions 88 shown in FIG. 5 should not be confused with the very thin protective oxide coating 66 illustrated in FIG. 4 which is grown over the exposed side edges of the raised polysilicon contacts after removal of gate oxide 46.

Spacers 88 may, alternatively, be grown by differential oxidation wherein the oxide will grow faster on the doped polysilicon comprising raised contacts 80a-80d than on epitaxial layer 20. Alternatively, spacer 88 may comprise other insulating materials such as nitride.

The NMOS region and collector contacts of any bipolar devices are then masked with photoresist 92. A P+ implant, using, for example, BF$_2$, is then made to provide source and drain regions 98a, 98b, 98c, and 98d in epitaxial layer 20 in the PMOS region as illustrated in FIG. 5.

Figure 6:
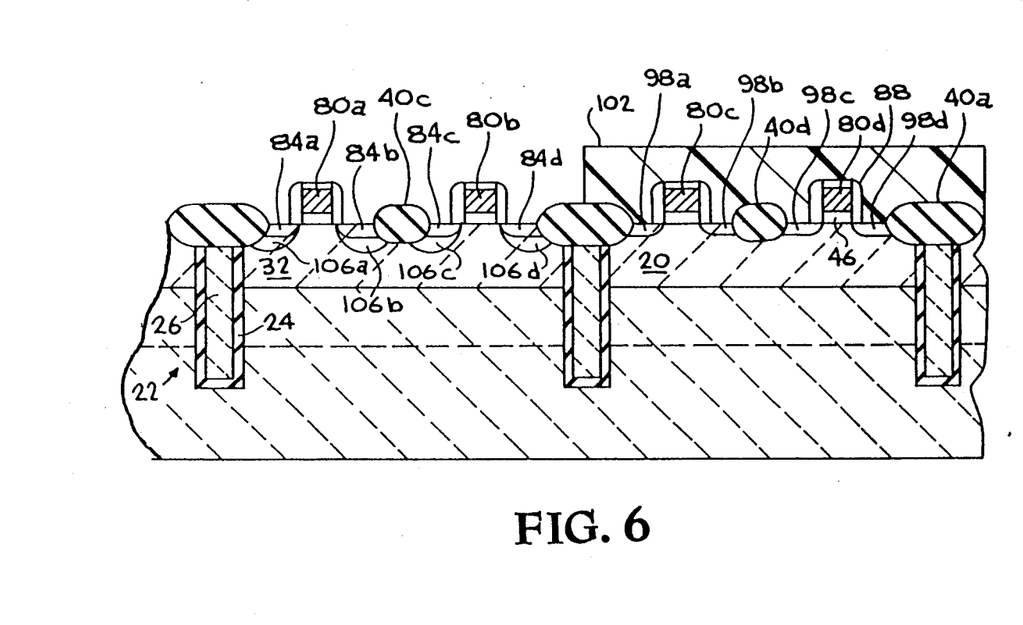

The PMOS regions, as well as any bipolar regions, are then masked with photoresist mask 102, as shown in FIG. 6, and N+ source and drain regions 106a, 106b, 106c, and 106d, respectively below LDD source and drain regions 84a-84d, are then formed by implantation with arsenic. Photoresist mask 102 is then stripped and an implant anneal is performed, e.g., at 1000° C. for 10 minutes, or by a "rapid thermal anneal".

Figure 7:
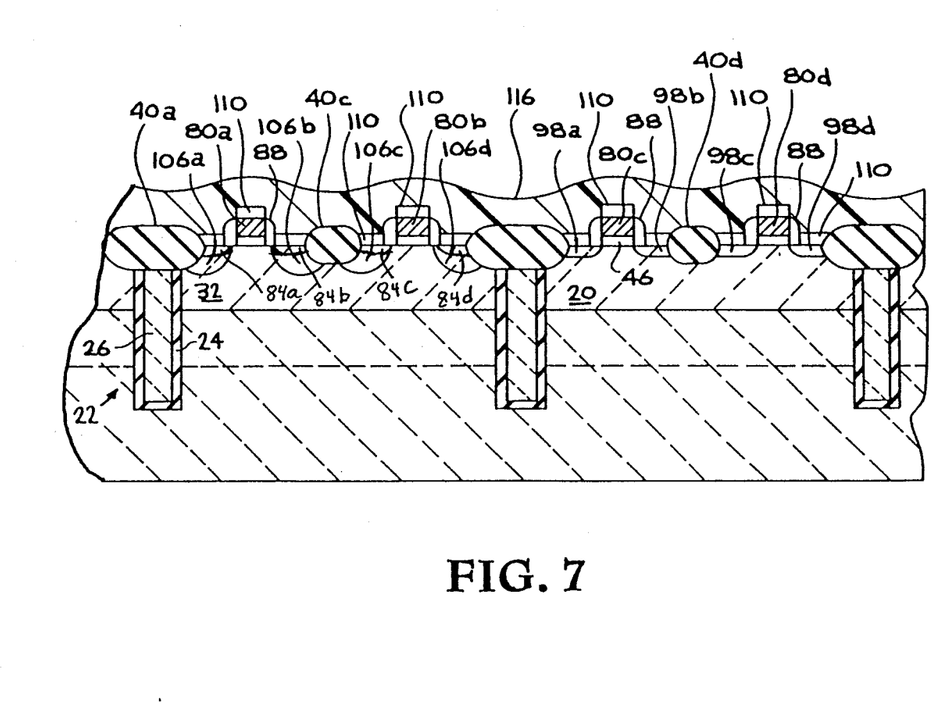

The remaining nitride on all the raised gate contacts is then stripped and a metal, capable of forming a silicide, such as, for example, platinum, or titanium, is deposited to form metal silicide layer 110 over the respective gate contacts 80a-80d, the NMOS source and drain regions 84a-84d, and the PMOS source and drain regions 98a-98d, as shown in FIG. 7.

Planarization layer 116 is then applied over the structure and planarized to clear the respective gate contacts, i.e., to expose the metal silicide coating 110 on the upper surface of the gate contacts 80a-80d. Planarization layer 116 may comprise an oxide, a nitride, or a polyimide, or any combination thereof, or any other insulation material.

Figure 8:
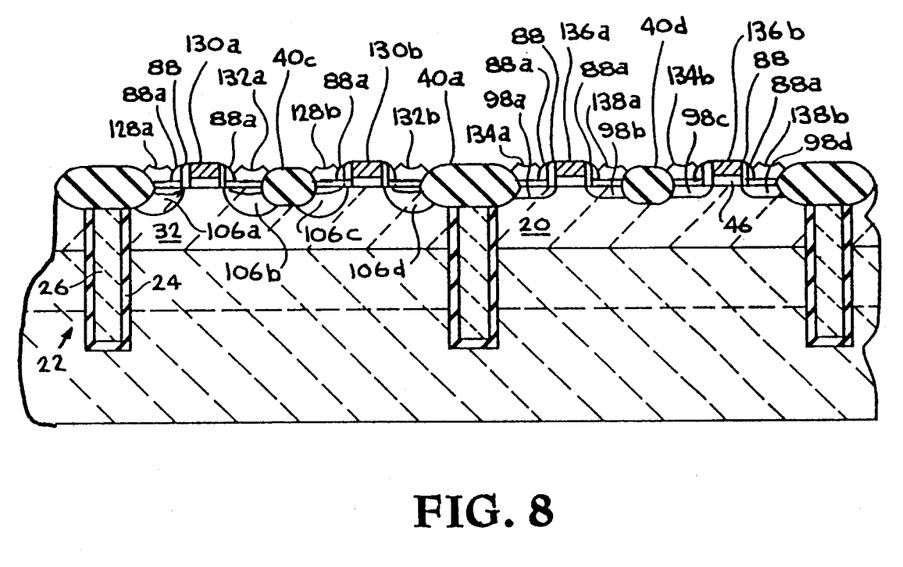

The structure is then blanket etched, as shown in FIG. 8, to clear the source and drain contacts. When planarization layer 116 is etched in this manner, additional spacer members 88a, comprising remnants of planarization layer 116, are left adjacent spacers 88, as further shown in FIG. 8. Spacers 88a act in conjunction with spacers 88 to separate the contacts from one another. Alternatively, these contacts may be "cut" by opening vias onto the silicide.

A metal layer, e.g., a 0.8 micron layer of aluminum over a barrier layer of TiW, is then deposited over the structure and masked to provide metal source contacts 128a and 128b, gate contacts 130a and 130b, and drain contacts 132a and 132b in the NMOS region; and source contacts 134a and 134b, gate contacts 136a and 136b, and drain contacts 138a and 138b in the PMOS region.

The foregoing describes one embodiment of the invention wherein the use of oxide spacers on the sides of the gate, coupled with the removal of the gate oxide over the source and drain, and the use of metal silicide over the contacts provides a more compact structure with self aligned contacts.

However, in a preferred embodiment, as will be explained below, the techniques just described may be also used to provide a structure which is highly planarized due to the provision of all raised polysilicon contacts, i.e., raised source and drain contacts as well as the raised gate contacts just described.

Figure 9:
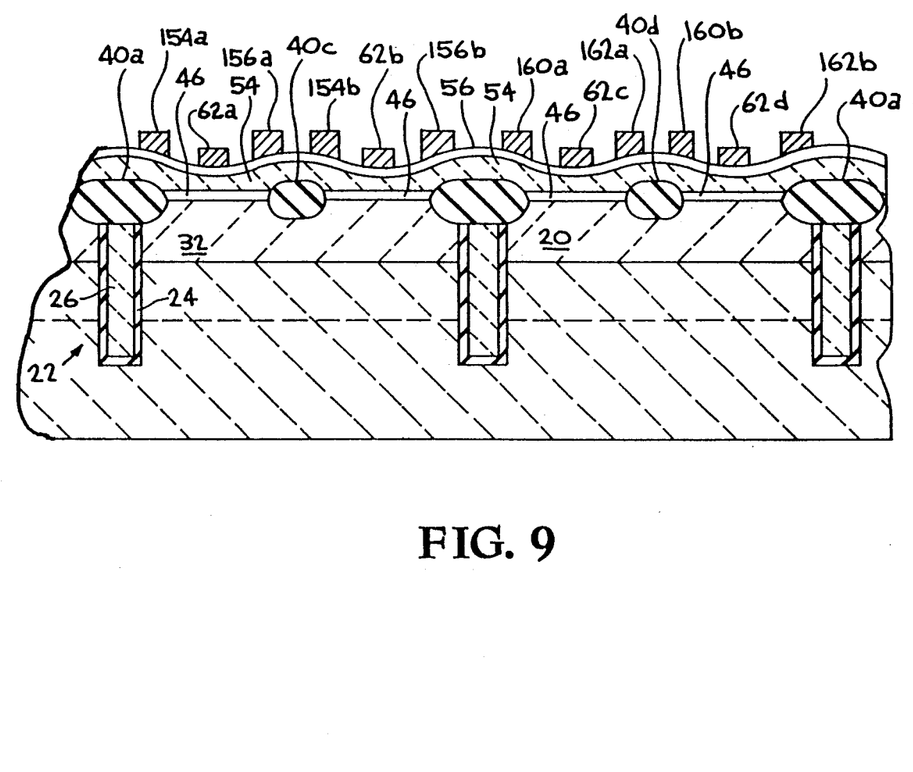
FIGS. 9-13 are fragmentary vertical cross-sectional views illustrating subsequent stages of the construction of another embodiment of the improved integrated circuit structure of the invention.

Turning now to FIG. 9, the structure previously described in FIGS. 1-2, is masked somewhat differently from the mask of FIG. 3 in the previous embodiment in that NMOS source masks 154a and 154b, NMOS drain masks 156a and 156b, PMOS source masks 160a and 160b, and PMOS drain masks 162a and 162b are also provided in addition to gate contact masks 62a–62d.

Figure 10:
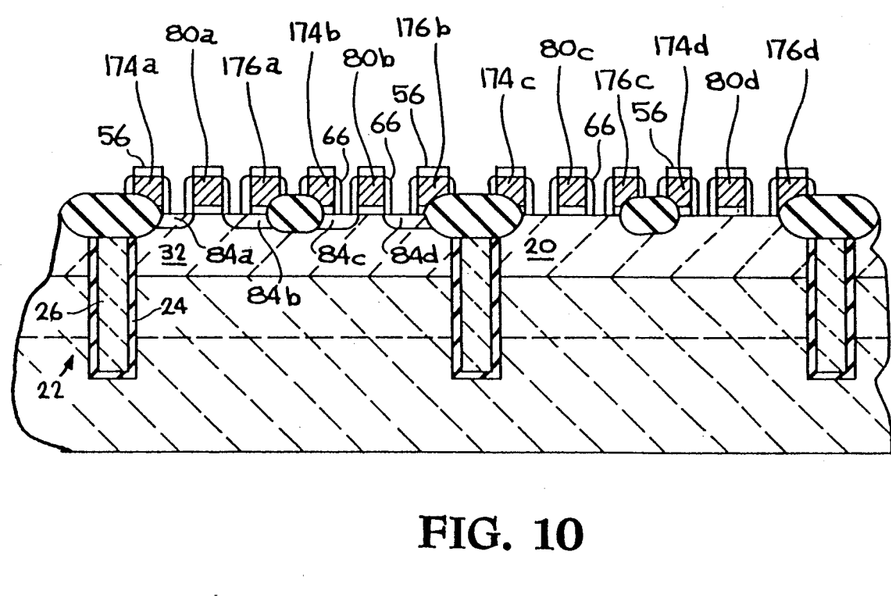

The remainder of the polysilicon is then removed as well as the underlying nitride layer as in the previously described embodiment leaving raised polysilicon source contacts 174a–174d, raised polysilicon gate contacts 80a–80d, and raised polysilicon drain contacts 176a–176d as shown in FIG. 10.

At this point the exposed portions of gate oxide layer 46 over the source and drain regions (in between the raised polysilicon source and gate contacts or in between the raised polysilicon gate and drain contacts) may be removed.

Figure 11:
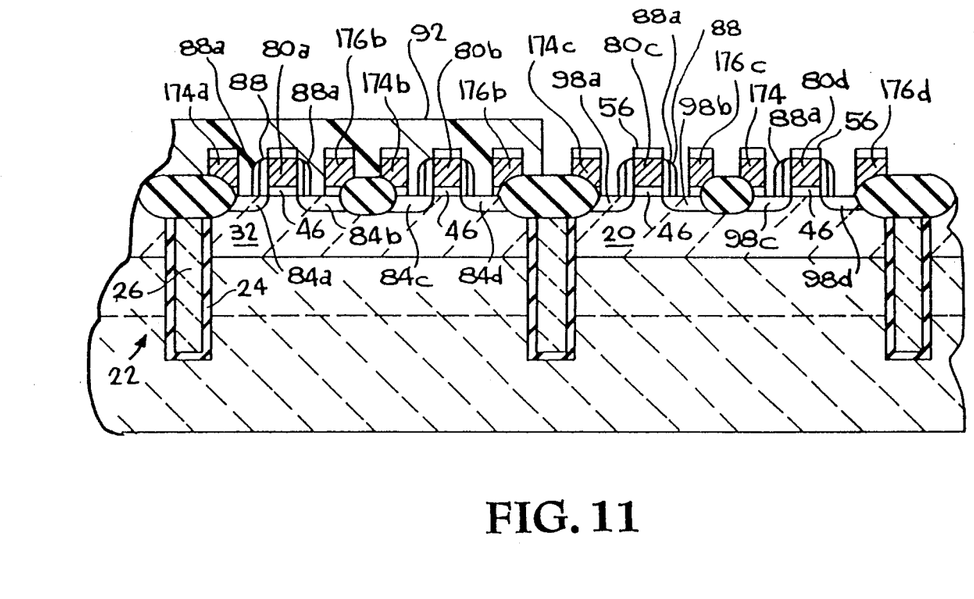
Figure 12:
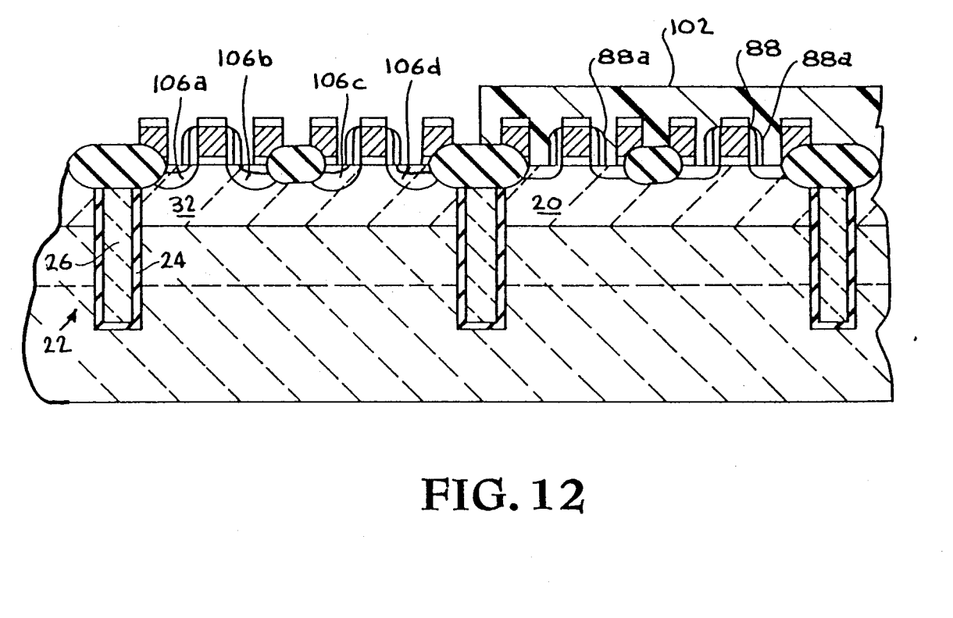
Figure 13:
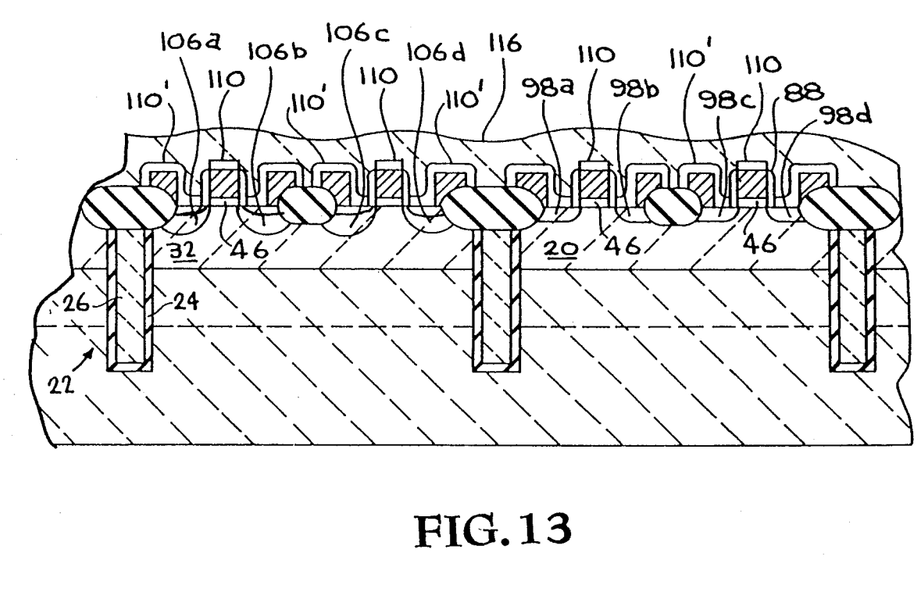

The resultant structure is then processed in FIGS. 11–13 in similar fashion to the process steps described and illustrated in FIGS. 5–7 to form oxide spacers 88 on the sidewalls of the raised polysilicon contacts. However, as shown in FIGS. 11 and 12, since all of the contacts are now raised in this embodiment, the oxide spacers, formed on the sides of the raised source and drain contacts, are removed prior to the implantation steps by appropriate masking of the gate regions.

The respective areas in FIGS. 11 and 12 are then masked in similar fashion to that shown for FIGS. 5 and 6 to form the respective source and drain implants in the PMOS and NMOS regions.

The silicide step then forms a conductive coating or layer of silicide 110' on the top and sides of the raised polysilicon source and drain contacts as well as over the source and drain regions to provide low resistance current paths to the respective raised electrode contacts as shown in FIG. 13.

As in the previous embodiment, a layer of oxide 116 is then formed over the structure after the siliciding step as seen in FIG. 13. However, unlike the prior embodiment, subsequent planarization opens all the contacts making further selective etching to clear the source and drain contacts unnecessary. The structure, due to the raised source and drain contacts, will be very planar with substantially no steps as will be appreciated from FIG. 14.

The final metallization and masking steps then form metal source contacts 186, metal gate contacts 188, and metal drain contacts 190. The resultant structure, as seen in FIG. 14, is a highly planarized structure with all self aligned contacts.

The resulting integrated circuit structure provides an improved construction of MOS devices which facilitates the formation of contacts thereto without cutting through the passivation glass to reach the source and drain regions thereby eliminating the critical alignment and process tolerance associated with via contacts. The gate resistance is lowered by using a polysilicon gate with direct contact to the gate polysilicon over the channel instead of bringing the contact to the side of the channel. In addition, the use of self aligned contacts permits a more compact construction by eliminating the need for protective oxides around cut areas.

Finally, the use of all raised polysilicon electrode contacts with metal silicide conductive paths thereon, in the preferred embodiment of the invention, results in the provision of a very planarized structure possessing high speed and low resistance and capacitance.

Having thus described the invention, what is claimed is:

1. An improved integrated circuit structure having one or more MOS devices formed therein comprising:
   (a) a P type silicon substrate having an N+ buried layer formed therein, an N type epitaxial silicon layer grown over said buried layer, and oxide isolation regions formed in said epitaxial layer and extending into said structure sufficiently to provide isolation between adjacent devices formed therein;
   (b) a polysilicon gate having a raised contact portion formed over a gate oxide layer on said epitaxial layer overlying a channel region formed in said epitaxial layer;
   (c) oxide spacer means on the sidewall of said raised gate contact portion;
   (d) source and drain regions formed in said epitaxial layer contiguous with said channel region and separated from adjacent devices in said structure by said isolation oxide regions;
   (e) polysilicon source and drain contacts on said epitaxial layer raised to approximately the same level as said raised polysilicon gate contact;
   (f) metal silicide conductive layer portions respectively overlying said source and drain regions in said epitaxial layer and over the sides and tops of said raised polysilicon source and drain contacts to thereby provide horizontal conductive paths extending from said oxide spacer means on the sidewalls of said raised polysilicon gate contact to said raised polysilicon source and drain contacts, and vertical conductive paths from said respective horizontal conductive paths up the sides of said raised polysilicon source and drain contacts to decrease the resistance of the horizontal and vertical conductive paths respectively between the source and drain regions in said epitaxial layer and the metal silicide on the top of said raised polysilicon source and drain contacts to which metal contacts will subsequently be formed; and
   (g) a layer of insulating material over said structure which has been planarized to expose the tops of said raised source, gate, and drain contacts;
whereby said structure having said raised contacts of even height comprises a highly planarized surface with self-aligned contacts and low resistance paths respectively between said tops of said raised source and drain contacts and said source and drain regions in said epitaxial layer.

* * * * *